(12) United States Patent
Michaud et al.

(10) Patent No.: US 11,244,971 B2
(45) Date of Patent: Feb. 8, 2022

(54) METHOD OF TRANSFERRING A THIN FILM FROM A SUBSTRATE TO A FLEXIBLE SUPPORT

(71) Applicant: COMMISSARIAT A L'ENERGIE ATOMIQUE ET AUX ENERGIES ALTERNATIVES, Paris (FR)

(72) Inventors: Laurent Michaud, Grenoble (FR); Clement Castan, Grenoble (FR); Frank Fournel, Grenoble (FR); Pierre Montmeat, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/797,207

(22) Filed: Feb. 21, 2020

(65) Prior Publication Data
US 2020/0350343 A1 Nov. 5, 2020

(30) Foreign Application Priority Data
Feb. 21, 2019 (FR) ..................................... 19 01735

(51) Int. Cl.
| H01L 27/12 | (2006.01) |
| C09J 7/29 | (2018.01) |
| H01L 21/02 | (2006.01) |
| H01L 21/20 | (2006.01) |

(52) U.S. Cl.
CPC ............ *H01L 27/1266* (2013.01); *C09J 7/29* (2018.01); *H01L 21/02367* (2013.01); *H01L 21/2007* (2013.01)

(58) Field of Classification Search
None
See application file for complete search history.

(56) References Cited

U.S. PATENT DOCUMENTS

| 6,521,511 B1 | 2/2003 | Inoue et al. |
| 2003/0040164 A1 | 2/2003 | Inoue et al. |
| 2007/0054469 A1 | 3/2007 | Yano et al. |

FOREIGN PATENT DOCUMENTS

EP    0 924 769 A1    6/1999

OTHER PUBLICATIONS

French Preliminary Search Report dated Feb. 13, 2020 in French Application 19 01735 filed Feb. 21, 2019 (with English Translation of Categories of Cited Documents & Written Opinion), 14 pages.

(Continued)

*Primary Examiner* — Alexander G Ghyka
(74) *Attorney, Agent, or Firm* — Oblon, McClelland, Maier & Neustadt, L.L.P.

(57) ABSTRACT

A method of transferring a thin film from a substrate to a flexible support that includes transfer of the flexible support by a layer of polymer, crosslinkable under ultraviolet light, directly on the thin film, the adhesion energy of the polymer evolving according to its degree of crosslinking, decreasing to an energy point d minimum adhesion achieved for a nominal crosslinking rate, then increasing for a crosslinking rate greater than the nominal crosslinking rate, then apply, on the polymer layer, an ultraviolet exposure parameterized so as to stiffen the polymer layer and have an adhesion energy between the thin film and the flexible support greater than an adhesion energy between the thin film and the substrate, then remove the substrate.

18 Claims, 5 Drawing Sheets

(56) References Cited

OTHER PUBLICATIONS

Anonymous, "Tapes for Semiconductor Process," Furukawa Electric Group, https://www.furukawa.co.jp/en/product/catalog/pdf/uvtape_e_p034.pdf, May 9, 2018, XP055647837, 12 pages.

Anonymous, "What is UV Tape? Tape for Semiconductor Process," Furukawa Electric Group, https://web.archive.org/web/20180713044348/https://www.furukawa.co.jp/uvtape/en/technology/uvtape.html, Jul. 13, 2018, XP05567842, 5 pages.

Do, H-S., et al., "Preparation and adhesion performance of UV-crosslinkable acrylic pressure sensitive adhesives," Journal of Adhesion Science and Technology, vol. 20, No. 13, Dec. 13, 2006, XP055647382, pp. 1529-1545.

Maszara, W. P., et al., "Bonding of silicon wafers for silicon-on-insulator," Journal of Applied Physics, vol. 64, No. 10, Nov. 15, 1988, XP00005002, pp. 4943-4950.

Montmeat, P. et al., "Transfer of ultra-thin semi-conductor films onto flexible substrates," ECS Transactions, vol. 75, No. 9, 2016, pp. 247-252.

[Fig. 1]
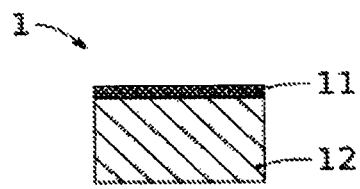
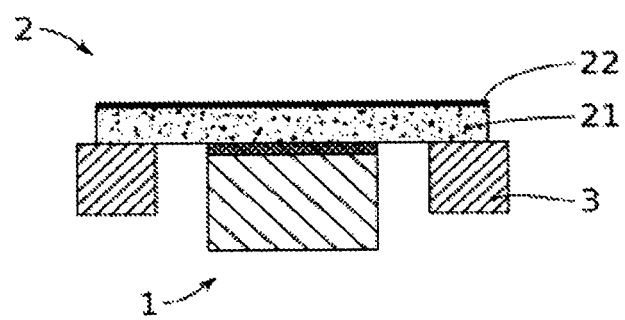
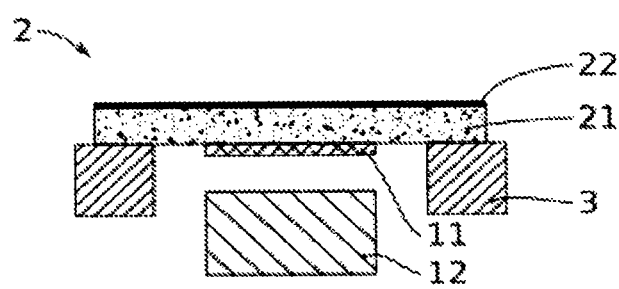

[Fig. 2]
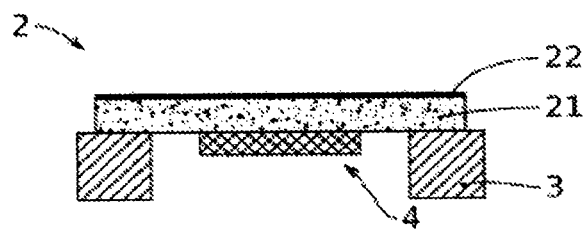
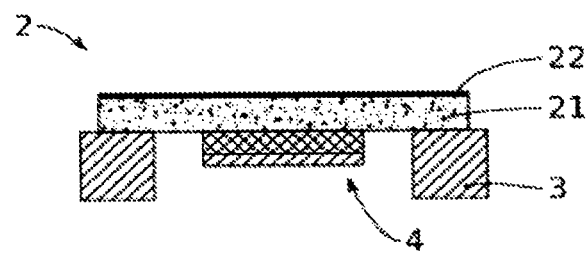
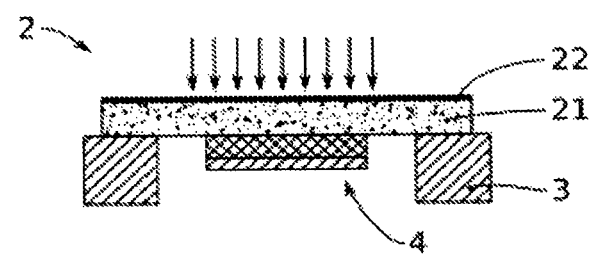
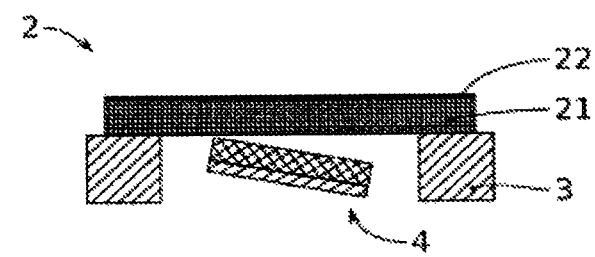

[Fig. 4]
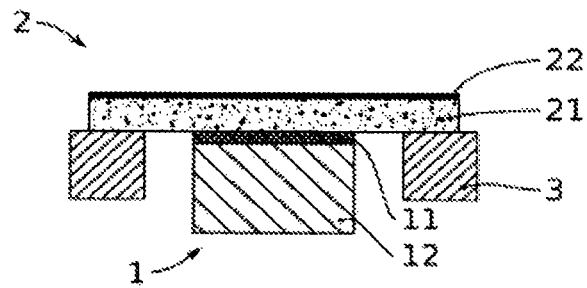
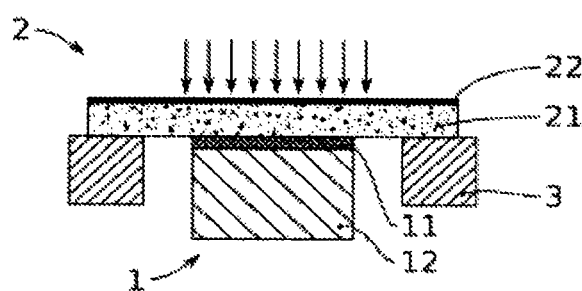
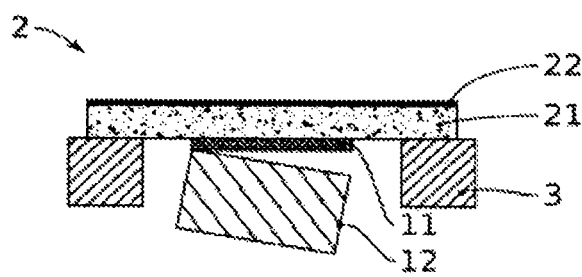
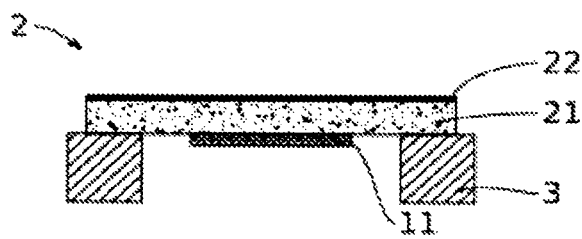

METHOD OF TRANSFERRING A THIN FILM FROM A SUBSTRATE TO A FLEXIBLE SUPPORT

TECHNICAL FIELD

The invention relates to methods for transferring a thin film onto a flexible support. It has particularly advantageously applications in the field of electronics on a flexible support.

STATE OF THE ART

For twenty years, electronics on flexible supports has seen a remarkable growth. The applications are varied: photovoltaic cells, organic diodes, biological sensors for in vivo measurements, etc.

In this context, it often seems necessary to develop a material, often inorganic, on the basis of which the electronic circuit is constituted, which can be associated with a flexible material, like an organic polymer, on the bases of which the flexible support is constituted. A good cohesion between the inorganic material constituting the electronic circuit must indeed be ensured, which is presented in the form of a more or less thick film, and the flexible support.

In the case where the film has a basis of a crystallised semi-conductive material, the methods for transferring the film are broadly used. For example, P. Montméat et al. (ECS Trans. 75, 247 (2016)) have been able to develop the transfer of a 200 nm silicon film, from an SOI (Silicon-On-Insulator) substrate, on a temporary support which is not very adhesive.

There are, moreover, method for manufacturing electronic components which implement flexible adhesive films (or "tapes"). These flexible adhesive films are called of the "UV-release" or "thermal-release" type, according to that they make it possible to release the electronic components that they support following an ultraviolet insolation or following a heat treatment. Generally, flexible adhesive films 2 of the "UV-release" type are used, as illustrated in appended FIG. 2, either to facilitate the handling of wafers, or fragile chips 4, or to protect wafers or chips 4 during aggressive or contaminating methods, such as grinding and cutting. The adhesion of the electronic components 4 to the flexible adhesive film 2 is often guaranteed by the presence, in the adhesive film, of an adhesive layer 21 made of cross-linking polymer, such as a UV-cross-linkable polyacrylate. The energy of adhering the electronic components 4 to the flexible adhesive film 2 is modulable according to the cross-linking rate of the polymer: it can be very high when it relates to ensuring the maintenance or the protection of the wafer 4, and it can be sufficiently low to facilitate the release of the wafers 4 at the end of manufacture. A heat treatment or a UV insolation highly decreases the adhesion energy of the flexible film 2. In particular, a person skilled in the art knows that a UV insolation according to the recommendations of the manufacturer (e.g. 1 J/cm$^2$ for the film Furukawa SP-537T-230) will polymerise the adhesive of the "UV-release" flexible film and degrade the adhesion properties thereof.

There is a need for a method for transferring a thin film onto a flexible support which is particularly suited to manufacturing microelectronic devices which, in particular, have advantageous applications in the field of electronics on flexible supports.

An aim of the present invention is therefore to propose a method for transferring a thin film from a substrate onto a flexible support which is particularly suited to manufacturing microelectronic devices which preferably have advantageous applications in the field of electronics on flexible supports.

Other aims, features and advantages of the present invention will appear upon examining the following description and the supporting drawings. It is understood that other advantages can be incorporated.

SUMMARY

To achieve this aim, according to one embodiment, a method for transferring a thin film from a substrate onto a flexible support is provided, the method comprising the following steps:

Providing a stack comprising at least one thin film extending over a first face of the substrate, each thin film adhering to the first face of the substrate with a given adhesion energy, Providing a flexible support comprising at least one layer with a basis of a polymer which is cross-linkable by ultraviolet insolation, the cross-linkable polymer being such that at least the rigidity thereof and the adhesion energy thereof develop according to the cross-linking rate thereof, the adhesion energy of the cross-linkable polymer developing in a non-monotonous manner, according to the cross-linking rate of the polymer, by decreasing from an initial adhesion energy, corresponding to an initial cross-linking rate of the polymer, until reaching a minimum adhesion energy for a nominal cross-linking rate, then by increasing for a cross-linking rate greater than the nominal cross-linking rate, Transferring the polymer layer of the flexible support directly on the thin film of the stack, the polymer having a cross-linking rate less than the nominal cross-linking rate, then Applying, on the polymer layer of the flexible support, an ultraviolet insolation configured such that the cross-linking rate of the polymer is greater than the nominal cross-linking rate to rigidify the polymer layer and to have an adhesion energy between the thin film and the flexible support greater than the adhesion energy between the thin film and the substrate, then Removing the substrate, such that the thin film is transferred onto the flexible support.

Thus, the insolation is configured so as to exceed a nominal insolation dose which would bring the polymer to the nominal cross-linking rate corresponding to the minimum adhesion energy point. The method utilises the curving of the development of the adhesion energy of the polymer according to the cross-linking rate thereof, the latter depending on the ultraviolet insolation which itself is applied. Advantageously, it provides for regaining adhesion energy between the flexible support and the thin film with respect to the minimum adhesion energy, while rigidifying the flexible support.

Another aspect of embodiments relates to a method for transferring a thin film from a substrate onto a flexible support, the method comprising the following steps:

Providing a stack comprising at least one thin film extending over a first face of the substrate, each thin film adhering to the first face of the substrate with a given adhesion energy, Providing a flexible support comprising at least one layer with a basis of a polymer which is cross-linkable by ultraviolet insolation, this polymer could be an acrylate, Transferring the polymer layer of the flexible support directly on the thin film of the stack, the polymer having a cross-linking rate less than the nominal cross-linking rate, corresponding to a minimum adhesion energy, then Applying, on the polymer layer of the flexible support, an ultraviolet insolation configured such that the cross-linking rate of the polymer is greater than the nominal cross-linking rate and is configured to have an adhesion energy between the thin film and the flexible support greater than the adhesion energy between the thin film and the substrate, then Removing the substrate, such that the thin film is transferred onto the flexible support.

Another aspect relates to a method for manufacturing a microelectronic device comprising the implementation of a transfer method such as introduced above.

BRIEF DESCRIPTION OF THE FIGURES

The aims, objectives, as well as the features and advantages of the invention will emerge better from the detailed description of an embodiment of the latter, which is illustrated by the following supporting drawings, wherein:

FIG. 1 schematically represents the steps of a transfer method tested by the inventors in the scope of the reflections having led to the present invention;

FIG. 2 schematically represents the manner in which the flexible adhesive films are used, such as described in the introduction of the present application;

FIG. 4 schematically represents the steps of the transfer method according to an embodiment of the invention.

Figure 3:
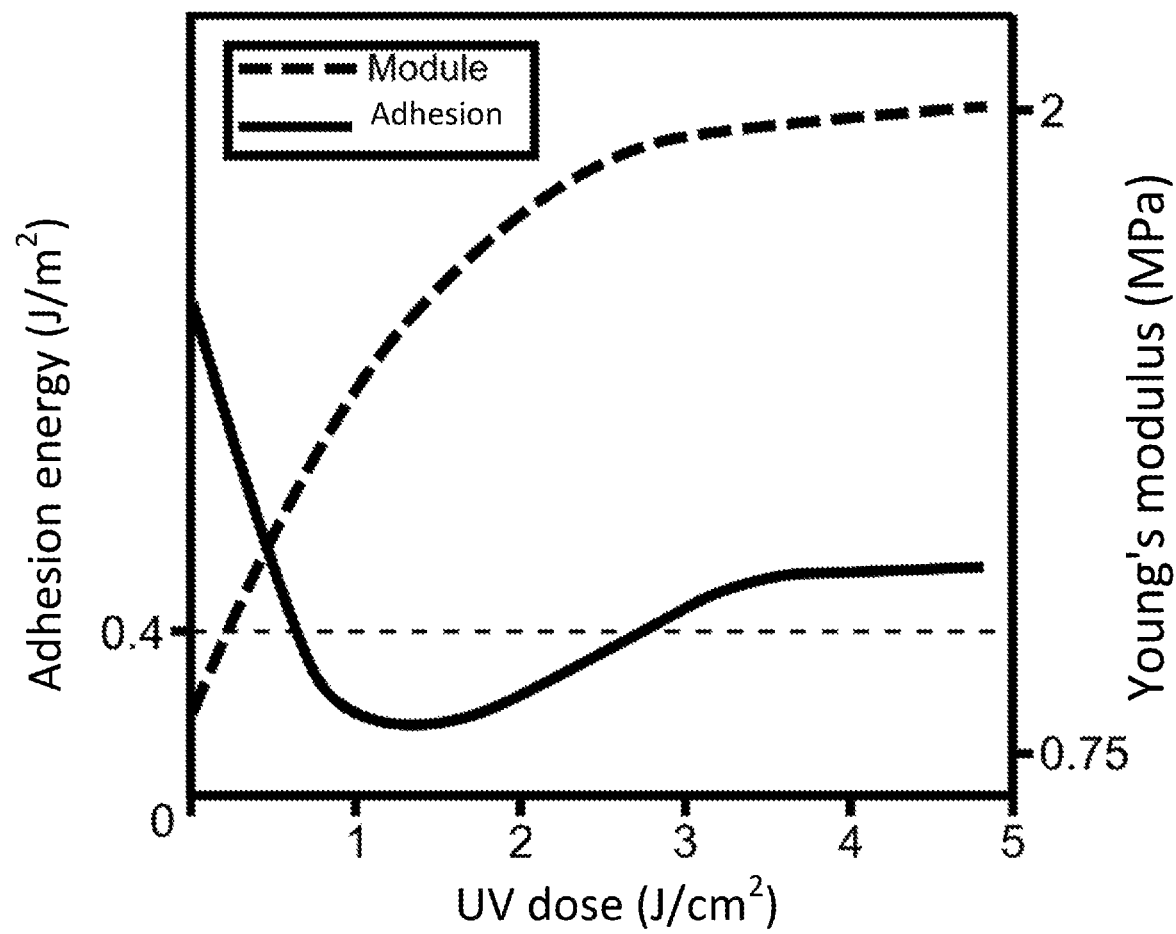
FIG. 3 graphically represents, on the one hand, the development of Young's modulus, on the other hand, the development of the adhesion energy of the flexible adhesive film Furukawa SP-537T-230 according to the ultraviolet insolation dose which itself is applied.

The drawings are given as examples and are not limiting of the invention. They constitute schematic principle representations of principle, intended to facilitate the understanding of the invention and are not necessarily to the scale of practical applications. In particular, the relative thicknesses of the different layers and films are not representative of reality.

DETAILED DESCRIPTION

Before starting a detailed review of embodiments, optional features are stated below which can possibly be used in association or alternatively:

the rigidity of the cross-linkable polymer increasing monotonously as the cross-linking rate of polymer increases, the application of the ultraviolet insolation can be configured such that the flexible support has, after the application of the ultraviolet insolation and before the removal of the substrate, a Young's modulus at least 1.5 times, preferably at least 2 times greater than the Young's modulus before the application of the ultraviolet insolation. The rigidity of the polymer layer of the flexible support can thus be sufficiently increased, due to the ultraviolet insolation, to avoid the cracking of the thin film during the removal of the substrate.

Alternatively or complementarily to the preceding feature, the application of the ultraviolet insolation is configured such that the flexible support has, after the application of the ultraviolet insolation and before the removal of the substrate, a Young's modulus less than 100 times, preferably less than 40 times, the Young's modulus thereof before the application of the ultraviolet insolation. It is thus ensured that the polymer layer of the flexible support remains sufficiently flexible for applications in the field of electronics on flexible supports;

According to another feature, the nominal cross-linking rate being known to be reached by applying a given nominal insolation dose on the polymer layer such as transferred, the application of the ultraviolet insolation is configured so as to apply, on the polymer layer such as transferred, an insolation dose at least 3 times greater than said nominal insolation dose; the insolation dose according to the material to be insolated; indeed, the behaviour (in adhesion and in rigidity) can vary from one cross-linkable polymer to another; in particular, the increase of the adhesion, after the nominal rate, can be more or less rapid; this can occur beyond an insolation dose 3 times greater than the nominal dose;

According to another feature, the nominal cross-linking rate being known to be reached by applying a given nominal insolation dose on the polymer layer such as transferred, the application of the ultraviolet insolation is configured so as to apply, on the polymer layer such as transferred, an insolation dose less than 10 times, preferably less than 4 times, said nominal insolation dose;

The minimum adhesion energy between the thin film and the flexible support can be less than the adhesion energy between the thin film and the substrate. In this case, the method therefore makes it possible to sufficiently regain adhesion energy of the thin film on the flexible support such that the latter becomes greater than the adhesion energy between the thin film and the substrate, such that the substrate can be removed;

The provision of the flexible support can be configured such that the cross-linkable polymer has an adhesion energy with the thin film greater than the adhesion energy between the thin film and the substrate, the transfer of the polymer layer on the thin film thus comprising an adhesion on one another;

The flexible support can have, before the application of the ultraviolet insolation, a Young's modulus strictly less than 10 MPa, preferably less than 2 MPa. As soon as the flexible support initially has a sufficient flexibility, the transfer of the flexible support on the stack makes it possible to reach, even before the application of the insolation, a good contact, even a good adhesion, between the flexible support and the thin film;

The cross-linkable polymer can comprise, or be constituted of, an acrylate polymer;

The thin film preferably has a thickness strictly less than 1 µm, preferably less than 200 nm;

The thin film can be composed on the basis of, or be constituted of, a magnetic, piezoelectric, metal or semi-conductive material (such as silicon, germanium, aluminium nitride, gallium nitride and indium phosphorus);

The thin film can comprise, or be constituted of, a crystalline material. Due to the cross-linking of the polymer, the flexible support can be sufficiently rigidified such that the removal of the substrate does not cause cracking of the thin film, including when it is composed on the basis of a crystalline material;

The transfer of the polymer layer on the thin film can be achieved by lamination or by spreading at least one portion of the flexible support, and more specifically, at least the polymer layer, on the thin film;

The substrate is preferably rigid, and can more specifically have a Young's modulus at least 10 times greater than the Young's modulus of the flexible support after the application of the ultraviolet insolation, the Young's modulus of the substrate being, for example, greater than 10 GPa;

The flexible support can further comprise a structuring film on which the polymer layer is deposited, the structuring film being made of an ultraviolet transparent material, for example, polyolefin. Complementarily or alternatively, the flexible support can be provided fixed on a rigid frame configured to facilitate the handling of the flexible support;

The stack provided can comprise a plurality of thin films disconnected from one another and distributed over the first face of the substrate, such that the plurality of thin films is transferred onto the flexible support.

By "less" and "greater", this means "less than or equal to" and "greater than or equal to", respectively. Equality is excluded by using the terms "strictly less than" and "strictly greater than". Also, the expressions of the type, "equal to, less than, greater than" extend from comparisons which could accommodate certain tolerances, in particular according to the magnitude of the values compared, and the measurement uncertainties. Values substantially equal, less, or greater, enter into the scope of interpretation of the invention.

By a "substantially equal to/greater than/less than" a given value parameter, this means that this parameter is equal to/greater than/less than the given value, more or less 20%, even 10%, close to this value. By a "substantially between" two given values parameter, this means that this parameter is, as a minimum, equal to the smallest given value, more or less 20%, even 10%, close to this value, and as a maximum, equal to the greatest given value, more or less 20%, even 10%, close to this value.

By a film with a basis of a material A, this means a film comprising this material A and possible other materials.

In the description below, the thicknesses are generally measured along directions perpendicular to the plane of the lower face of a layer or of a substrate on which the layer is arranged. Thus, the thicknesses are generally taken along a vertical direction in the figures represented.

The parameters of a UV cross-linking are generally power, exposure time and particularly the exposure method.

The inventors designated by the present application, who have a lot of knowledge from the prior art presented in the introduction, have been led to consider that flexible adhesive films, used for the handling or for the protection of wafers or chips, should initially be supports which are well-suited to proceed with transfers of thin films.

In order to verify the relevance of this original idea, they have considered the initial structure, presented in FIG. 1. They have more specifically provided a stack 1 comprising a thin film 11 extending over a first face of a substrate 12, the thin film adhering to the first face of the substrate with a given adhesion energy. Also, more specifically, the initial structure considered comprises a stack 1 of which the thin film 11, integral with the rigid substrate 12, has a thickness strictly less than 1 µm, preferably less than 200 nm. They have moreover provided a flexible support 2 of the "UV-release" type, comprising at least one layer 21 with the basis of a polymer which is cross-linkable by ultraviolet insolation. So as to transfer the thin film 11 on the flexible support 2, the idea is to adhere the flexible support 2 on the surface of the thin film 11 and to thus transfer this film 11 on the flexible support 2, such a transfer requiring that the adhesion energy between the thin film 11 and the flexible support 2 is greater than the adhesion energy between the thin film 11 and the rigid substrate 12. This condition is fulfilled when, for example, the film Furukawa SP-537T-230 is used as a flexible support 2, in order to transfer a thin film 11 there from the initial structure. It is noted here that the cross-linkable polymer of such a film is constituted of an acrylate polymer. In reference to FIGS. 1, 2 and 4, it is also noted that:

the film Furukawa SP-537T-230 further comprises a structuring film 22 on which the polymer layer 21 is deposited, the structuring film 22 being made of an ultraviolet transparent material, for example made of polyolefin, and that the film Furukawa SP-537T-230 is provided fixed on a rigid frame 3 configured to facilitate the handling of it.

However, under these initially suitable conditions, the inventors have observed that such a transfer method inadvertently results in the cracking of the thin film 11 on the flexible support 2. Such a cracking of the thin film 11 is all the more so problematic for the film before the transfer thereof of the crystalline features, that it is sought to conserve it. The transfer method initially tested, and such as illustrated in FIG. 1 does not therefore make it possible for a transfer under good conditions.

So as to avoid the cracking of the thin film 11, the inventors have thought to modify the mechanical properties of the flexible support 2 before the transfer. Indeed, they have sensed that the cracking of the thin film 11, due to the transfer thereof from the substrate 12 onto the flexible support 2, is linked to a transfer of elastic stresses which could be avoided, or at least limited, by rigidifying the flexible support 2; yet, it is known to rigidify the flexible support 2 by polymerising it by ultraviolet insolation, the cross-linkable polymer being such that at least the rigidity thereof develops according to the cross-linking rate thereof. However, the flexible support 2 considered, in particular in the example mentioned above, is precisely configured such that, subject to an insolation dose recommended by the manufacturer thereof, and that a person skilled in the art is therefore encouraged to respect, the adhesion energy thereof decreases, until it is at a minimum, in order to make it possible to release the wafer or the chip that it is designed to support. In fact, the inventors have observed that the adhesion energy of the flexible support 2 which is reached by insolating it with the recommended insolation dose is less than the adhesion energy between the thin film 11 and the substrate 12 considered; it is subsequently no longer possible to transfer the thin film 11 from the substrate 12 onto the flexible support 2.

The method aims to make it possible, all the same, to transfer the thin film 11 from the substrate 12 onto the flexible support 2, in particular in the configuration tested by the inventors in the way detailed above.

With knowledge from their observations, the inventors have sought to go further in the characterisation of the flexible support according to the ultraviolet insolation which itself is applied. Knowing that the parameters of a UV cross-linking are generally power, exposure time and particularly the exposure method, said characterisation has led them to establish the graph in appended FIG. 3. According to this graph, it appears that:

on the one hand, the adhesion energy of the cross-linkable polymer non-monotonously according to the cross-linking rate of the polymer, by decreasing from an initial adhesion energy, corresponding to an initial cross-linking rate of the polymer, until reaching a minimum adhesion energy for a nominal cross-linking rate (that recommended by the manufacturer), then by increasing for a cross-linking rate greater than the nominal cross-linking rate, and on the other hand, the rigidity of the cross-linkable polymer, and therefore of the flexible support 2, increases monotonously as the cross-linking rate of the polymer increases, the cross-linking rate of the polymer being directly linked to the ultraviolet insolation dose applied on the polymer layer.

FIG. 3 has a development curve of the adhesion in a given experimental example. It can be an acrylate of which the behaviour actually follows this development. This FIG. 3, and in particular the adhesion curve thereof, can see variations in shape according to the material used. For example, when the nominal insolation rate is reached, the adhesion can remain stable, at a low threshold level, during a broad range of insolation rates. A low level can thus be encountered. However, from a certain insolation rate, the adhesion ends by increasing. This behaviour, disclosed by the inventors, is not met encountered in the state of the art, in particular because the insolation rate is never pushed as far.

Figure 5:
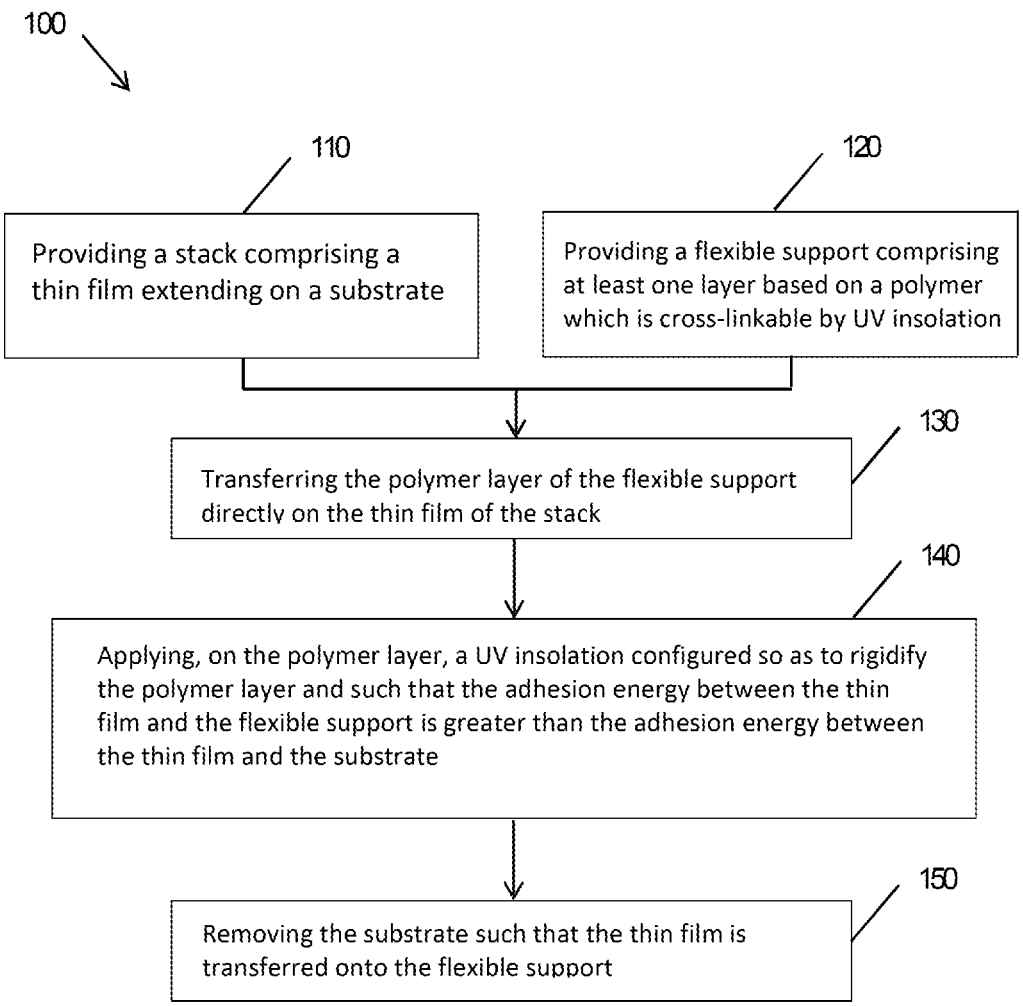
FIG. 5 represents a flowchart of the steps of the transfer method according to an embodiment of the invention.

It is in view of this characterisation that the inventors have devised the method, which is described below in reference to FIGS. 4 and 5.

The transfer method 100 comprises, just like in the test detailed above, the following steps:

Providing 110 a stack 1 comprising at least one thin film 11 extending over a first face of the substrate 12, each thin film 11 adhering to the first face of the substrate 10 with a given adhesion energy, and Providing 120 a flexible support 2 comprising at least one layer 21 with the basis of a polymer which is cross-linkable by ultraviolet insolation, then Transferring 130 the polymer layer 21 of the flexible support 2 directly on said at least one thin film 11 of the stack 1, the polymer having a cross-linking rate less than the nominal cross-linking rate, then Applying 140, on the polymer layer 21 of the flexible support 2, an ultraviolet insolation, then Removing 150 the substrate.

The transfer method 100 is distinguished from the test detailed above, mainly in that the application 140 is configured such that the cross-linking rate of the polymer is greater than the nominal cross-linking rate. An insolation overdose relative to the nominal insolation dose is therefore applied 140 on the polymer layer 21 of the flexible support 21 which consequently has, as the graph of FIG. 3 quantifies:

to rigidify the polymer layer 21, beyond the rigidification reached with application of the nominal insolation dose, which makes it possible to also better limit the cracking phenomenon to be avoided, and to regain adhesion energy between each thin film 11 and the flexible support 2 such that it is greater than the adhesion energy between the thin film 11 and the substrate 12, which makes it possible to remove the substrate 12, to thus obtain the transfer 100 of the thin film 11 on the flexible support 2 under good conditions, preserving the integrity, and in particular the crystalline nature, of each thin film.

The method therefore proposes a use of the adhesive flexible films which differs from that presented in the state of the art. A person skilled in the art usually insolates the adhesive flexible films to decrease the adhesion thereof to a stack and facilitate the total detachment of the stack. According to the usual method of use thereof, the mechanical aspect of the adhesive flexible films must not change too much to make it possible, generally, to make it possible for "pick and place" steps. In the first approach, an insolation of an adhesive flexible film, could not be used to transfer under good conditions, a thin film on this film used as a flexible support. According to the method, an insolation pushed further, relative to that which requires the usual use which is made of it, makes it possible to improve the adhesion of the flexible film and to greatly increase the rigidity in order to ensure an ideal mechanical behaviour of the adhesive flexible film, as a flexible support, for the transfer of thin film(s).

Preferably, the flexible support 2 has, after the application 140 of the ultraviolet insolation and before the removal 150 of the substrate 12, a Young's modulus at least 1.5 times, preferably at least 2 times, greater than the Young's modulus thereof before the application 140 of the ultraviolet insolation.

It is thus ensured that the rigidity of the polymer layer of the flexible support 2 is sufficiently increased, due to the ultraviolet insolation, to avoid, or at least limit, the cracking of the thin film during the removal of the substrate.

Also more preferably, the application 140 of the ultraviolet insolation is configured such that the flexible support 2 has, after the application 140 of the ultraviolet insolation and before the removal 150 of the substrate 12, a Young's modulus less than 100 times, preferably less than 40 times, the Young's modulus thereof before the application 140 of the ultraviolet insolation.

It is thus ensured that the polymer layer 21 of the flexible support 2 remains sufficiently flexible such that a microelectronic device comprising the flexible support 2, as being manufactured by implementing the method, and possibly other manufacturing steps, that is suitable for applications in the field of electronics on flexible supports.

Moreover, the flexible support 2 has, before the application 140 of the ultraviolet insolation, a Young's modulus strictly less than 10 MPa, preferably less than 2 MPa. Subsequently, the Young's modulus of the flexible support 2 is, after the application 140 of the ultraviolet insolation and before the removal 150 of the substrate 12, less than 100 MPa, preferably less than 8 MPa. In comparison, the substrate 12 is rigid; it typically has a Young's modulus at least 10 times greater than the Young's modulus of the flexible support 2 after the application 140 of the ultraviolet insolation. The Young's modulus of the substrate is, for example, greater than 1 GPa.

Correspondingly, the preferable limitations mentioned above can be expressed in terms of the cross-linking rate of the polymer layer 21. Thus, the nominal cross-linking rate being known to be reached by applying a given nominal insolation dose onto the polymer layer such as transferred 130, the application 140 of the ultraviolet insolation is preferably configured so as to apply, on the polymer layer such as transferred 130, an insolation dose at least 3 times greater than said nominal insolation dose. Likewise, the application 140 of the ultraviolet insolation is also more preferably configured so as to apply, on the polymer layer such as transferred 130, an insolation dose less than 10 times, preferably less than 4 times, said nominal insolation dose. It will be noted that the costs linked to the implementation of the step of applying 140 the ultraviolet insolation are thus limited.

The transfer 130 of the polymer layer 21 on the thin film 11 can be achieved by lamination or by spreading at least one portion of the flexible support 2, and more specifically at least the polymer layer 21, on the thin film 11. Subsequently, the provision 120 of them flexible support 2 cannot be configured such that the cross-linkable polymer has an adhesion energy with the thin film 11 greater than the adhesion energy between the thin film 11 and the substrate 12. The cross-linkable polymer can even be initially in a state of fluidity not guaranteeing it any adhesive property, even though the transfer 130 of the polymer layer 21 on the thin film 11 does not comprise an adhesion on one another. When the polymer is initially in a cross-linking state itself guaranteeing an adhesive property, possibly greater than the adhesion energy between the thin film 11 and the substrate 12, it is preferable that the Young's modulus thereof is, all the same, strictly less than 10 MPa, preferably less than 2 MPa, as already specified above, in order to ensure a good adhesion of the flexible support 2 on the thin film 11. When the flexible support 2 is laminated on the thin film, it is preferable that it is maintained in a rigid frame 3 which facilitates the handling of it. The use of such a frame 3 is however not compulsory, in particular when the cross-linkable polymer is spread on the thin film 11. In the latter case also, the use of a structuring film 22 can be advantageous and consist of laminating the structuring film 22 on the spread polymer. However, the use of a structuring film is not necessary, the polymer layer could be initially sufficiently rigid.

The removal 150 of the substrate 12 from the thin film 11 can be mechanically carried out. For example, the substrate 12 can be ground from the second face thereof opposite the first face thereof. Alternatively, it is not excluded to exert a mechanical detachment stress to separate or start the detachment of the substrate 12 from the thin film 11. Alternatively or complementarily, the removal 150 of the substrate 12 from the thin film 11 can be carried out chemically, such that the flexible film is sufficiently resistant to the chemistry brought into play.

In a manner which is not at all limiting, and strictly illustrative, two specific embodiment examples are given below which charts the progression followed by the inventors to reach the method. These embodiments examples have been implemented on wafers which are 200 mm in diameter.

Example 1

According to this first example, a fluorinated compound (3M EGC novec 2702) is deposited by centrifugal coating on an SOI-type structure comprising, from the first face thereof, a 200 mm Si layer, then a 400 nm buried oxide layer. Using the adhesive BrewerBOND 305, this structure is adhered on the first face of a temporary handle, subsequently used as a substrate 12, and constituted of a small silicon wafer. The adhesion energy between the temporary handle and the structure is evaluated at 0.4 J/m² (DCB method according to W. P. Maszara, G. Goetz, A. Caviglia, and J. B. McKitterick, J. Appl. Phys. 64, 4943 (1988)).

The bulk silicon and the buried oxide layer are then removed from the structure by a series of mechanical and chemical thinning processes.

On the thin layer thus obtained, a flexible adhesive film Furukawa SP-537T-230 is laminated, as a flexible support 2, using a rigid frame maintaining the flexible adhesive film. Then, the temporary handle is mechanically removed. The 200 nm monocrystalline silicon film is thus on the flexible film. Numerous cracks are observed on the thin film. Furthermore, it is observed that all of the thin film is transferred onto the flexible film, which indicates that, without any insolation, the adhesion energy between the flexible film (not insolated) and the thin film is greater than 0.4 J/m².

An alternative to the preceding method consists of exposing the flexible film to different UV doses, then to disassemble the thin film.

When the insolation dose is close to that recommended by the manufacturer, that is a dose substantially equal to 1 J/cm², it is observed that the thin film is only transferred partially. In this case, the adhesion energy between the flexible film and the thin film is therefore lower than 0.4 J/m².

When the insolation dose is close to 4 J/cm², a complete transfer of the thin film on the flexible film is observed. This demonstrates that the adhesion of the flexible film obtained after an insolation of 4 J/cm² is better than the adhesion obtained after an insolation of 1 J/cm² and in particular, greater than 0.4 J/m². Furthermore, the Young's modulus of the flexible film is substantially equal to 1.75 MPa, and no cracking is observed on the thin film. It is concluded from this, that an insolation dose of 3 to 4 times greater than the dose recommended by the manufacturer makes it possible to rigidify the flexible film and to make it more adhesive. These two properties mean that the transfer without cracking of a 200 nm silicon monocrystalline film becomes possible.

Example 2

Rectangular patterns of 2×42 mm² of silicon are defined, thanks to a photolithographic method associated with an etching, on an SOI-type structure comprising, from the first face thereof, a 200 nm Si layer, then a 400 nm buried oxide layer. The stack 1 thus obtained undergoes the same steps as the stack 1 of the example 1. After obtaining thin films, corresponding to the patterns mentioned above, on the temporary handle, used as a substrate 12, an adhesive flexible film Furukawa SP-537T-230 is laminated on the thin films, then this is insolated with a dose of 4 J/cm². The temporary handle can then be demonstrated and silicon patterns transferred onto a flexible film mounted on a metal frame is observed. The flexible film can thus be cut to individually study or use each silicon pattern.

The invention is not limited to the embodiments described above and extends to all the embodiments covered by the claims.

In particular, the thin film 11 can be composed on the basis of, or be constituted of, a magnetic or piezoelectric material. When the thin film is composed on the basis of, or be constituted of, a semi-conductive material, this material is not necessarily silicon, but can also be on the basis of germanium, aluminium nitride, gallium nitride or indium phosphorus.

Other flexible adhesive films on the market, such as those known under the commercial names Lintec D510T and Lintec D650, can be used as a flexible support. Other UV cross-linkable polymers like acrylate polymer can also be considered, such as polymethacrylates and polyvinyl siloxanes.

Moreover, if the invention has particularly advantageous applications in the field of electronics on flexible supports, it is not limited to these types of applications. It can, for example, be applied to stress engineering, in particular on a thin metal film, like sodium.

The invention claimed is:

1. A method for transferring a thin film from a substrate on a flexible support, the method comprising:

providing a stack comprising at least one thin film extending over a first face of the substrate, each thin film adhering to the first face of the substrate with a given adhesion energy, providing a flexible support comprising at least one layer based on a polymer cross-linkable by ultraviolet exposure, the cross-linkable polymer being such that at least a rigidity thereof and an adhesion energy thereof develop according to a cross-linking rate thereof, the adhesion energy of the cross-linkable polymer developing non-monotonously according to the cross-linking rate of the polymer, by decreasing from an initial adhesion energy, corresponding to an initial cross-linking rate of the polymer, until reaching a minimum adhesion energy for a nominal cross-linking rate, then by increasing for a cross-linking rate greater than the nominal cross-linking rate, transferring the polymer layer of the flexible support directly on said at least one thin film of the stack, the polymer having a cross-linking rate less than the nominal cross-linking rate, then applying, on the polymer layer of the flexible support, an ultraviolet insolation configured such that the cross-linking rate of the polymer is greater than the nominal cross-linking rate to rigidify the polymer layer and to have an adhesion energy between the thin film and the flexible support greater than the adhesion energy between the thin film and the substrate, then removing the substrate, such that the thin film is transferred onto the flexible support.

2. The method according to claim 1, wherein, the rigidity of the cross-linkable polymer increasing monotonously as the cross-linking rate of the polymer increases, the application of the ultraviolet insolation is configured such that the flexible support has, after the application of the ultraviolet insolation and before the removal of the substrate, a Young's modulus at least 1.5 times, greater than the Young's modulus thereof before the application of the ultraviolet insolation.

3. The method according to claim 2, wherein the application of the ultraviolet insolation is configured such that the flexible support has, after the application of the ultraviolet insolation and before the removal of the substrate, a Young's modulus less than 100 times, the Young's modulus thereof before the application of the ultraviolet insolation.

4. The method according to claim 1, wherein, the nominal cross-linking rate being known to be reached by applying a given nominal insolation dose on the polymer layer such as transferred, the application of the ultraviolet insolation is configured so as to apply, on the polymer layer such as transferred, an insolation dose at least 3 times greater than said nominal insolation dose.

5. The method according to claim 1, wherein, the nominal cross-linking rate being known to be reached by applying a given nominal insolation dose on the polymer layer such as transferred, the application of the ultraviolet insolation is configured so as to apply, on the polymer layer such as transferred, an insolation dose less than 10 times, said nominal insolation dose.

6. The method according to claim 1, wherein the provision of the flexible support is configured such that the cross-linkable polymer has an adhesion energy with the thin film greater than the adhesion energy between the thin film and the substrate, the transfer of the polymer layer on the thin film thus comprising a bonding on one another.

7. The method according to claim 1, wherein the flexible support has, before the application of the ultraviolet insolation, a Young's modulus strictly less than 10 MPa.

8. The method according to claim 1, wherein the cross-linkable polymer comprises an acrylate polymer.

9. The method according to claim 1, wherein the thin film is composed on the basis of, or is constituted of, a magnetic, metal, piezoelectric or semi-conductive material.

10. The method according to claim 1, wherein the thin film comprises a crystalline material.

11. The method according to claim 1, wherein the transfer of the polymer layer on the thin layer is carried out by lamination or by spreading at least one portion of the flexible support, on the thin film.

12. The method according claim 1, wherein the substrate has a Young's modulus at least 10 times greater than the Young's modulus of the flexible support after the application of the ultraviolet insolation.

13. The method according to claim 1, wherein the flexible support further comprises a structuring film on which the polymer layer is deposited, the structuring film being made of a transparent ultraviolet material.

14. The method according to claim 1, wherein the stack provided comprises a plurality of thin films disconnected from one another and distributed on the first face of the substrate, such that the plurality of thin films is transferred onto the flexible support.

15. A method for transferring a thin film from a substrate onto a flexible support, the method comprising:

providing a stack comprising at least one thin film extending over a first face of the substrate, each thin film adhering to the first face of the substrate with a given adhesion energy, providing a flexible support comprising at least one layer on the basis of a polymer which is cross-linkable by ultraviolet insolation, transferring the polymer layer of the flexible support directly on the thin film of the stack, the polymer having a cross-linking rate less than a nominal cross-linking rate corresponding to a minimum adhesion energy, then applying, on the polymer layer of the flexible support, an ultraviolet insolation configured such that the cross-linking rate of the polymer is greater than the nominal cross-linking rate and is configured to have an adhesion energy between the thin film and the flexible support greater than the adhesion energy between the thin film and the substrate, then removing the substrate, such that the thin layer is transferred onto the flexible support.

16. The method according to claim 15, wherein the polymer comprises, or consists of, an acrylate polymer.

17. A method for manufacturing a microelectronic device comprising the implementation of the method for transferring a thin film from a substrate on a flexible support according to claim 1.

18. The method according to claim 1, wherein, the nominal cross-linking rate being known to be reached by applying a given nominal insolation dose on the polymer layer such as transferred, the application of the ultraviolet insolation is configured so as to apply, on the polymer layer such as transferred, an insolation dose less than 4 times, said nominal insolation dose.

* * * * *